United States Patent
Ngo

(10) Patent No.: US 6,975,473 B2
(45) Date of Patent: Dec. 13, 2005

(54) POWER EFFICIENT OVERSHOOT PROTECTION DURING AN OPERATING MODE TRANSITION

(75) Inventor: Tuan Van Ngo, Eden Prairie, MN (US)

(73) Assignee: Texas Instruments Incorporated, Dallas, TX (US)

(*) Notice: Subject to any disclaimer, the term of this patent is extended or adjusted under 35 U.S.C. 154(b) by 195 days.

(21) Appl. No.: 10/234,262

(22) Filed: Sep. 3, 2002

(65) Prior Publication Data

US 2004/0042109 A1 Mar. 4, 2004

(51) Int. Cl.[7] ............................ G11B 5/03; G11B 5/09; G11B 5/02

(52) U.S. Cl. ............................ 360/66; 360/46; 360/68

(58) Field of Search ............................ 360/61, 66, 68, 360/46, 65, 67

(56) References Cited

U.S. PATENT DOCUMENTS

| | | | |
|---|---|---|---|
| 6,215,607 B1 | 4/2001 | Ngo | |
| 6,226,141 B1 | 5/2001 | Teterud | |
| 6,271,978 B1 * | 8/2001 | Block et al. | .................. 360/46 |
| 6,366,421 B2 | 4/2002 | Teterud | |
| 6,381,086 B1 | 4/2002 | Koenig et al. | |
| 6,400,190 B1 | 6/2002 | Lacombe | |

* cited by examiner

*Primary Examiner*—David Hudspeth
*Assistant Examiner*—Daniel L. Negrón
(74) *Attorney, Agent, or Firm*—W. Daniel Swayze, Jr.; W. James Brady; Frederick J. Telecky, Jr.

(57) ABSTRACT

A system and method provide overshoot protection to facilitate driving a load by output circuitry in response to a transition from a first operating mode to a second operating mode. The overshoot protection occurs by masking an input bias from biasing the output circuitry for an initial part of the second operating mode based on a transition to the second operating mode, and then allowing the input bias to bias the output circuitry in a desired manner in a subsequent part of the second operating mode.

7 Claims, 6 Drawing Sheets

POWER EFFICIENT OVERSHOOT PROTECTION DURING AN OPERATING MODE TRANSITION

TECHNICAL FIELD

The present invention relates to electrical circuits and, more particularly, to a power efficient approach to mitigate overshoot associated with a transition in an operating mode.

BACKGROUND OF INVENTION

A hard disk drive generally includes one or more rotating disks or platters and a spindle motor that is controlled to cause the disks to rotate. Data is generally stored in the form of a sequence of magnetically polarized regions on the surface of the disk. One or more read/write heads, which is sensitive to changes in magnetic flux, reads and/or writes data to the disks as it is supported by an arm above the surface of the disks in close proximity relative to the disks. An actuator motor (typically a "voice coil motor" or VCM) controls the positioning of the arm for moving read/write heads relative to the surface of the disks.

As a disk rotates under the read/write head, the read/write head "flies" on a thin cushion of air created by the motion of the disk. The read/write head reads data from a disk by sensing flux changes on the magnetic surface of an associated disk as it passes beneath the read/write head. Various types of disk drives include several disks, each surface of which has an associated read/write head. The read/write head includes a small coil (or winding) of wire through which current flows to read or write data relative to the disks. The head employs an inductive coil to generate magnetic fields, which form magnetic patterns on the medium representing the binary data (e.g., ones and zeros). The orientation of the patterns depends on the direction of electrical current flow through the inductive coil. That is, writing binary data entails selectively changing, or reversing, the direction of current flow through the head. The direction of current flow through the coil is the controlled by a write driver. In order to write data, the write driver drives electric current through the write head to create a temporary magnetic field which magnetizes a small region of the disk at the current position of the write head.

When the write driver activates write current, it is desirable that little or no overshoot occur. If large overshoot of the write current occurs, data can be overwritten to an adjacent track. A short settling time of the write current to its final (steady state) value also is desirable after it is turned on. For example, a short settling time enables bits of data to be packed more closely, which can improved the data density per track.

SUMMARY

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

The present invention relates generally to a system and method for mitigating overshoot associated with driving a load, such as might otherwise occur in response to transitioning from a first operating mode to a second operating mode. The overshoot protection occurs by masking an input bias from biasing the output circuitry for an initial part of the second operating mode based on transitioning to the second operating mode. After the initial part of the second operating mode, the input bias can be provided to the output circuitry in a manner to allow desired biasing of the output circuitry in the second operating mode with little or no overshoot.

For example, the output circuitry can include a current mirror that is used to drive an inductive load with current functionally related to the input bias during the second operating mode. The masking can be implemented by holding an input of the current mirror low during the initial part of the second operating mode, such that the biasing of the current mirror can be prevented for this initial period.

By way of further example, when implemented in connection with a disk drive system, the present approach can mitigate overshoot and long settling time often associated with the write current that occurs during a read-to-write transition. The method can be implemented in a manner that consumes less power than most conventional approaches.

The following description and the annexed drawings set forth certain illustrative aspects of the invention. These aspects are indicative, however, of but a few of the various ways in which the principles of the invention may be employed. Other advantages and novel features of the invention will become apparent from the following detailed description of the invention when considered in conjunction with the drawings.

DETAILED DESCRIPTION

The present invention relates generally to a system and method for providing overshoot protection, such as to facilitate driving a load by output circuitry in response to a transition from a first operating mode to a second operating mode. The overshoot protection occurs by masking an input bias from biasing the output circuitry for an initial part of the second operating mode based on the transition to the second operating mode, and then allowing the input bias to bias the output circuitry in a desired manner in a subsequent part of the second operating mode. As a result of this approach, overshooting of the input bias provided to the output circuitry and, in turn, biasing of the load can be mitigated and associated settling time also improved.

Figure 1:
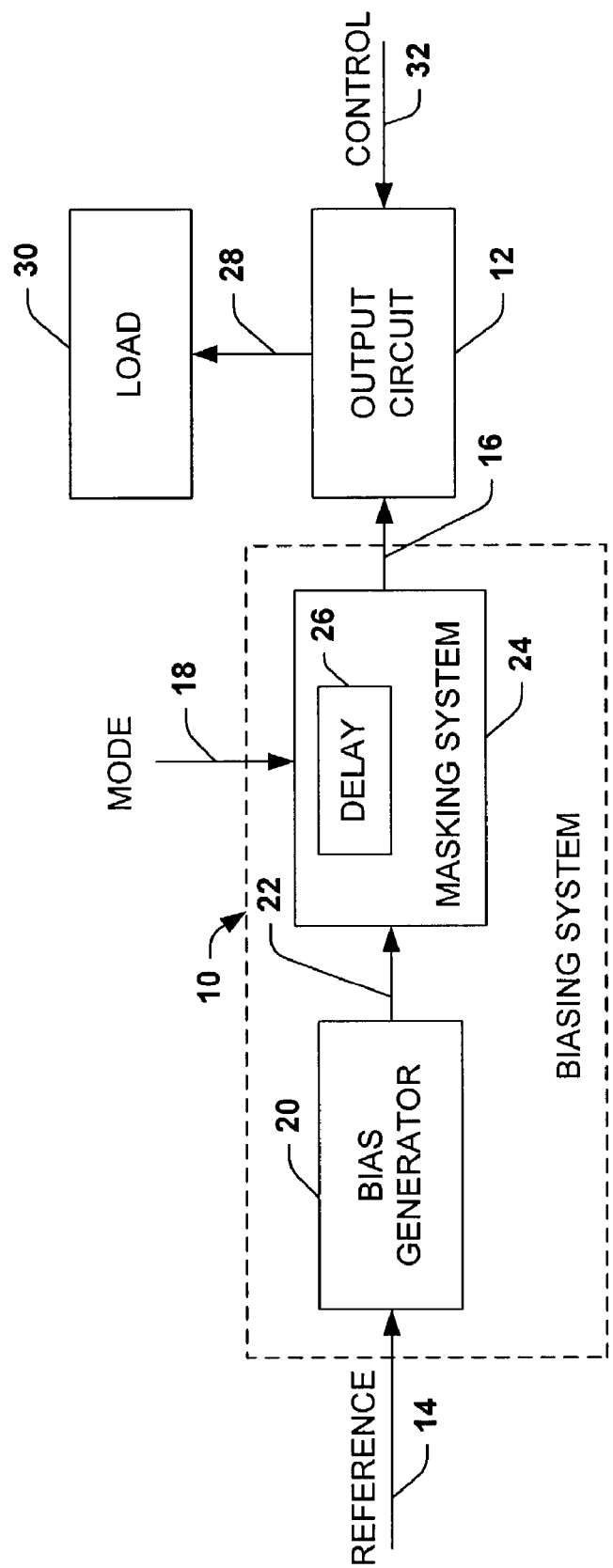
FIG. 1 is a block diagram of an overshoot protection system in accordance with an aspect of the present invention.

FIG. 1 illustrates a biasing system 10 operative to bias an output circuit 12 in accordance with an aspect of the present invention. The biasing system 10 receives one or more reference signals 14 and supplies a corresponding bias 16 to the output circuit 12 according to the reference signal and an operating mode. The operating mode, for example, is defined by a mode selection signal 18. The biasing system 10 thus is programmed and/or configured to delay biasing the output circuit 12 in response to a transition between the operating modes, such as indicated by the mode selection signal 18.

In the example of FIG. 1, the biasing system 10 includes a bias generator 20 that is operative to generate an internal bias 22 based on the reference signal 14. The bias generator supplies the bias 22 to a masking system 24. In accordance with an aspect of the present invention, the masking system 24 is operative either to mask the bias 22 from being provided to the output circuit 12 or to permit biasing of the output circuit by the bias 16. According to an aspect of the present invention, the masking system 24 is operative to mask the biasing of the output circuit 12 for a period of time so as to delay biasing the output circuit 12 based on the mode signal 18 indicating a transition to a next operating mode requiring the biasing.

The masking system 24, for example, includes a delay element 26 that delays application of the bias 16 to the output circuit 12 (e.g., for a period of less than about 10 nanoseconds). The masking system 24, for example, can implement the delay provided by the delay element 26 in response to the mode signal 18 indicating a transition from a first to a second of the operating modes. It is to be understood that the bias 16 can be the same as the bias 22 generated by the bias generator 20. Alternatively, the bias 16 could be different from the bias 22, such as being functionally related (e.g., proportional) to such bias.

By delaying application of the bias 16 for an initial part of the second operating mode, according to an aspect of the present invention, the bias 16 provided to output circuit 12 has little or no overshoot. As a result, the output circuit can in turn provide an improved output signal 28 to drive an associated load 30 based on the bias 16. The output circuit 12 also can provide the output signal 28 signal based on one or more control signals 34 provided to the output circuit 12. The control signals 32, for example, control the direction of current supplied by the output circuit 12 to the load 30. It will be appreciated that the improved output signal exhibits reduced overshoot and improved settling time when compared to prior biasing arrangements. Additionally, as described herein, the improved output signal can be generated with less power consumption relative to such prior arrangements.

By way of further example, the output circuit 12 can be part of a disk drive system that controls energizing an inductive load 30, such as can include a magneto resistive (MR) head, for writing or reading data relative to one or more disks. The mode signal 18 thus can indicate whether data is to be written or read relative to the disks.

Figure 2:
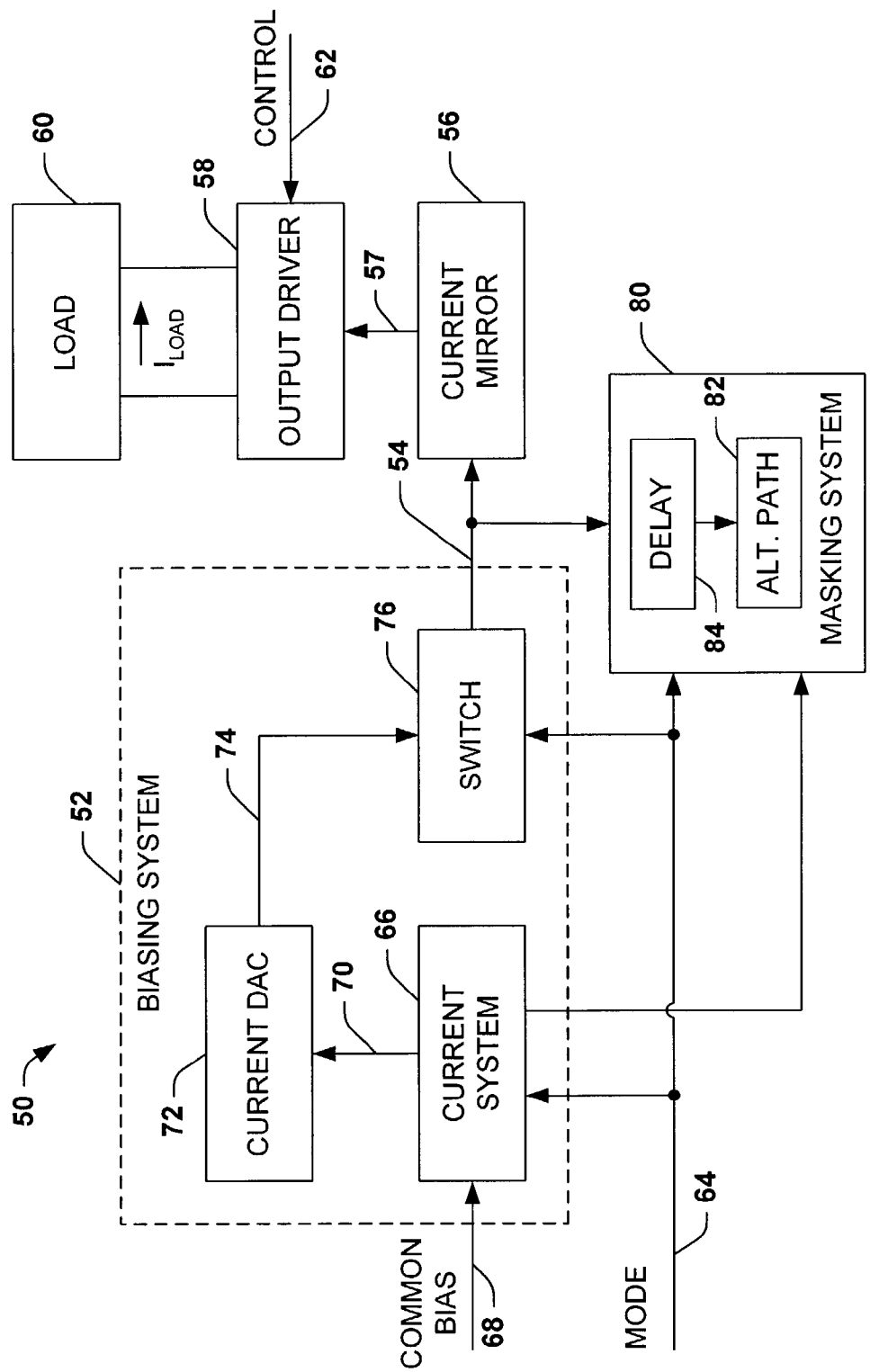
FIG. 2 is another block diagram of an overshoot protection system in accordance with an aspect of the present invention.

FIG. 2 is an example of a current driver system 50 that can be utilized to mitigate overshoot and long settling of current supplied to a load in connection with a transition between operating loads. The system 50 includes a biasing system 52 that supplies an input bias current 54 to bias an output current mirror 56. The current mirror 56 in turn supplies current 57 to an associated output driver 58 functionally related to (e.g., proportional to) the input bias current 54. The driver 58, which can include a bridge circuit, controls current $I_{LOAD}$ that is provided to an associated inductive load 60 based on one or more control signals 62. For example, the load 60 is thin film transducer that is operative to write data relative to a storage medium, such as a magnetic storage medium (e.g., a disk). The driver 58 thus controls the direction of the current through the load 60 based on the control signal 62.

The biasing system 52 receives a mode signal 64 that indicates an operating mode for the system 50. The mode signal 64, for example, can be a binary signal having a first logic level indicative of a first operating mode and a second logic level indicative of a second operating mode of the system. Alternatively, there can be more than two possible modes indicated by the mode signal 64.

Turning to the contents of the biasing system 52, the biasing system includes a current system 66 that receive as inputs one or more common bias reference signals 68 and the mode signal 64. The current system 66 generates a master current 70 based on the reference signal 68, which it provides to a current digital-to-analog converter (DAC) 72. The DAC 72 supplies an input bias current 74 to a switch 76, which, for example, can include one or more semiconductor switch devices. The switch 76 receives the mode signal 64 as a control input. Thus, the switch 76 is turned ON or OFF based on the mode signal 64 to control application of the bias current 54 to the current mirror 56. The switch 76 is operative to couple the bias current 74 to the current mirror 56 through the switch based on the mode signal 64, and thereby provide the bias current 54. It is to be appreciated that the bias current 54 usually will be equivalent (or at least functionally related) to the bias current 74 provided by the current DAC 72.

When the switch 76 is turned on while the DAC 72 provides the bias current 74, a significant overshoot in the input bias 54 can occur. In accordance with an aspect of the present invention, a masking system 80 is coupled to mitigate overshoot in the bias current 54, such as by steering current away from the current mirror 56. More particularly, the masking system 80 is configured to delay biasing the current mirror 56 with the bias current 54 for a short initial time period in response to the mode signal 64 indicating a transition from a first to a second of two or more operating modes. For purposes of simplicity of explanation, it is assumed that the bias current 54 is used to bias the current mirror 56 in the second operating mode to enable the driver 58 to energize the load in a desired manner.

The masking system 80 provides an alternative current path 82 through which the bias current 54 can be steered (e.g., shunted) away from the current mirror 56 for an initial part of a second operating mode. The alternative path 82 can include a series of one or more transistors or other switches such as connected between an input of the current mirror and electrical ground or another low potential to facilitate steering the bias current 54 away from the current mirror 56. The masking system 80 also includes a delay element 84 that is operative to control a duration in which the alternative path 82 is active to steer the bias current 54 away from the current mirror 56 after transitioning to the second operating mode. This overshoot is undesirable since it may overwrite the data on the adjacent tracks. The delay element 84 can be any circuitry operative to delay a transition in the mode signal 64, such as an inverter. It is to be understood and appreciated that typically less than about ten nanoseconds of delay (e.g., a couple nanoseconds) can even be sufficient, and that the amount of delay need not be very accurate to provide the benefits of reduced overshoot and enhanced settling time in accordance with an aspect of the present invention. Thus, after implementing the delay, the alternative path 82 is turned OFF or otherwise removed from operation so that the input bias current 54 can be provided to the current mirror 56.

As a result of the masking system 80 providing the alternative path 82 to steer the bias current 54 away from the current mirror 56 for an initial part of the second operating mode, overshoot in the bias current 54 that is provided to the current mirror when the switch 76 turned ON, can be diverted to the alternative path 82. After implementing the delay, the masking system 80 slowly removes the alternative path 82, so that little or no overshoot is observed in the bias 54 that is provided to the current mirror 56. Because overshoot can be effectively removed from the input bias 54 to the current mirror 56 during this initial period, according to an aspect of the present invention, the output current 57 provided to the driver 58 facilitates driving the load 60 with current exhibiting little or no overshoot. The amount of overshoot reduction in the output current 57 from the current mirror 56 will generally depend on the ratio of the current mirror. By way of example, if the current mirror 56 has a current ratio of 10:1, any overshoot in its input bias 54 will be increased an order of magnitude. The overall delay in biasing the current mirror 56 can be approximately 10 to 30 nanoseconds (e.g., about 15 nanoseconds).

Figure 3:
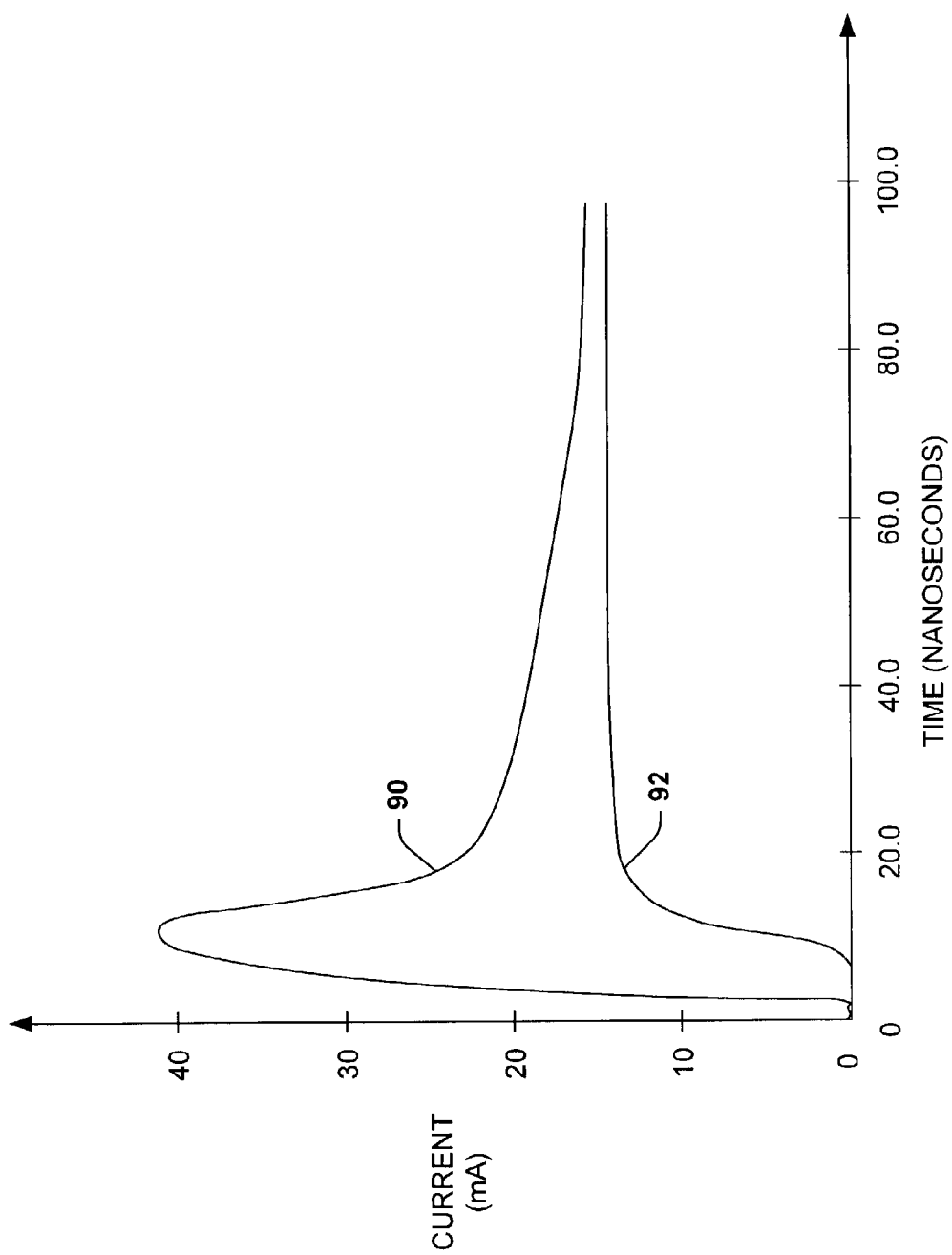
FIG. 3 is a graph illustrating a comparison of current supplied to a load using a conventional approach and current supplied to a load in accordance with an aspect of the present invention.

FIG. 3 is a graph illustrating a comparison between output current from a driver circuit for a transition in operating modes. The currents are plotted as a function of time commensurate with the driver circuit implementing the transition from a read mode to a write mode. The particular example of FIG. 3 depicts a write current 90 for a conventional system and write current 92 for a system implemented in accordance with an aspect of the present invention.

In the conventional approach, significant overshoot (e.g., about 20 mA) exists for about the first twenty nanoseconds, such as due to the bias current being provided directly to the output in response to transitioning from the read mode to the write mode. Additionally, the conventional approach exhibits a significant settling time to decay from its peak overshoot. This might correspond to a situation, for example, where the input bias exhibits 2 mA overshoot and is supplied to a 10:1 current mirror that provides the output current 90.

In contrast, the current 92 provided by a system in accordance with an aspect of the present invention ramps up quickly with little or no overshoot and stabilizes to a steady state stable current in a substantially shorter time than the prior approach period (e.g., about 15 nanoseconds).

Figure 4:
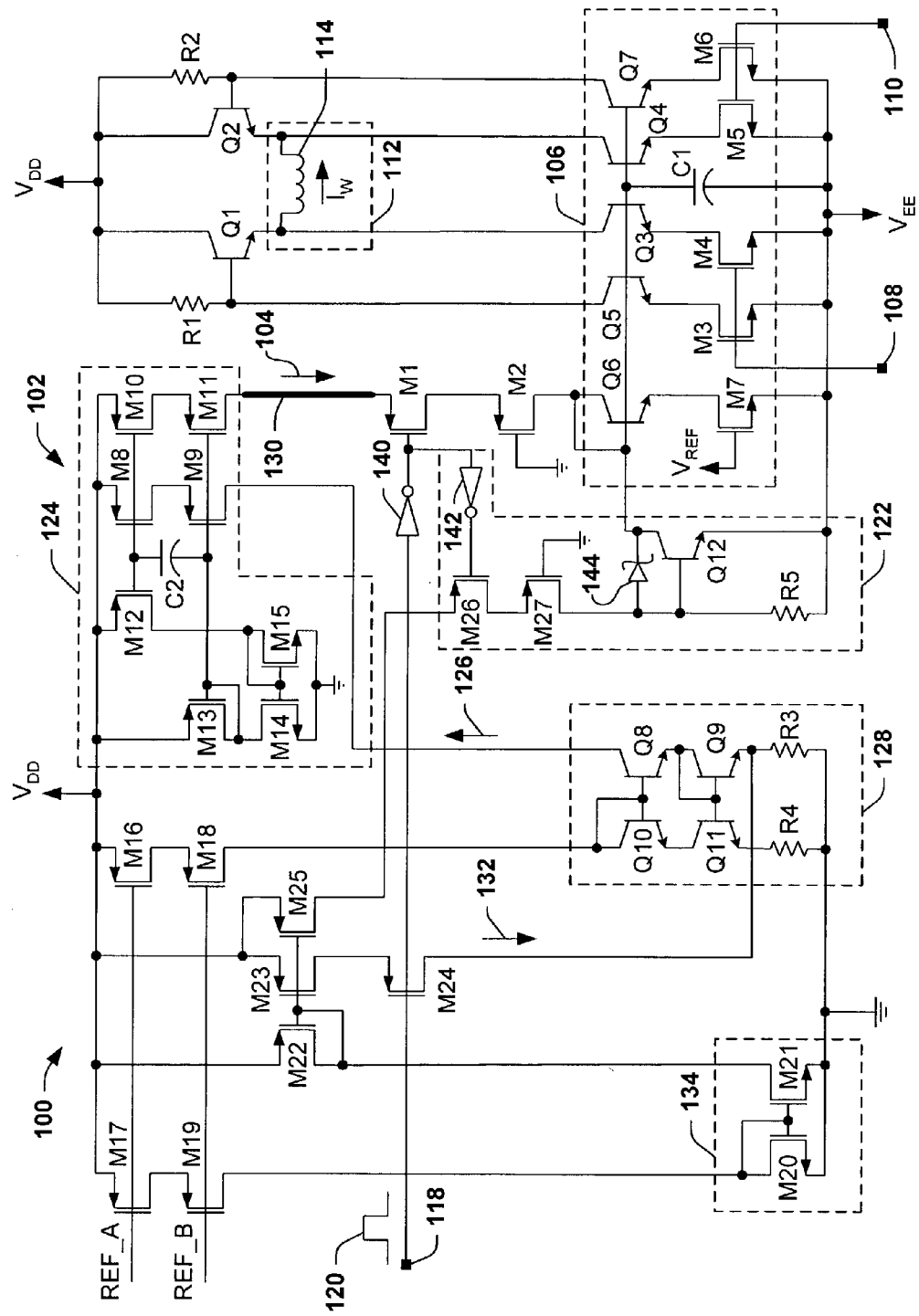
FIG. 4 is a circuit diagram illustrating an example of driver circuitry implementing overshoot protection in accordance with an aspect of the present invention.

FIG. 4 is an example of write driver circuitry 100 that can mitigate, overshoot and improve settling time for write current $I_W$ in accordance with an aspect of the present invention. The circuit 100 includes a bias generating portion 102 that is operative to supply a bias current 104 to an output current mirror 106. In this example, the bias current 104 biases the current mirror 106 during a write mode, such as to enable data to be written to an associated storage medium (not shown). The current mirror 106 is controlled by a pair of inputs (e.g., complementary inputs) 108 and 110 to control the switching of write data to a head device 112. The head 112, for example, includes an inductor 114 through which the write current $I_W$ is provided to control writing data based on the inputs at 108 and 110. The write current $I_W$ is functionally related (e.g., proportional) to the bias current 104, such as according to the current ratio of the current mirror 106.

For example, the inductive load 114 can be an external thin film transducer connected to the outputs of the driver circuit through a flex connection. The inputs of the driver at 108 and 110 are operated from an internal reference voltage VREF (e.g., about 2 volts) and an external voltage $V_{EE}$ (e.g., about −3 volts) to provide a CMOS level swing from 0 to about 5 volts. Driver circuitry includes an upper set of transistors Q1 and Q2 and a lower set of transistors Q3 and Q4, such as arranged in an H-bridge configuration. The switching of write data relative to the inductive load 114 is implemented by switching transistors M3 and M4 and M5 and M6 based on the signals provided at inputs 108 and 110. M6 is coupled to control the driver transistor Q2 through transistor Q7 based on the input at 110.

By way of further example, when the input at 108 is high (e.g., about 2 volts) and when the input at 110 is low (e.g., about −3 volts), the switching transistors M3 and M4 are on and transistors M5 and M6 are off. Accordingly, the write current $I_W$ will go from Q3 through the inductive load 114 and to Q5 to the positive supply voltage $V_{DD}$ (e.g., about 5 volts). At such time, the transistor Q2 also is on and thus pulls the base of Q2 to a voltage less than the potential of Q1's base. The current mirror 106 also includes a main input portion formed of transistors Q6 and M7 in which the collector of Q6 is coupled to receive the bias current 104 through transistors M1 and M2. The transistor M1 is used to turn on the selected write channel based on the mode signal 120 provided at the input 120. The transistor M2 is cascoded with M1 to help prevent breakdown of M1.

Data can be written when the circuitry 100 is operating in a write mode. The circuitry 100 includes an input 118 that receives a mode signal 120 indicating whether the circuitry is operating in a read mode or a write mode. In this example, it is assumed that a logic low input at 118 corresponds to a read mode and a logic high signal at 118 corresponds to the write mode. As described herein, the mode signal 120 is coupled to control a transistor M1 that is turned on or off based on the mode signal 120 for controlling application of the bias current 104 to the current mirror 106.

The mode signal 120 also is used to control a masking system 122 in accordance with an aspect of the present invention. As described herein, the masking system 122 is coupled to the current mirror 106 for steering the bias current 104 away from the current mirror for an initial part of a write mode in response to a transition from a read mode to a write mode, as indicated by the mode signal 120 (e.g., a low to high transition). In particular, the masking system 122 is coupled to the base and collector of diode connected Q6.

In this example, the bias current 104 is generated by a DAC 124 based on a master current 126 generated by an associated current mirror 128. For purposes of simplicity of explanation, a simplified DAC 124 is shown. Those skilled in the art will understand and appreciate other configurations of write current DACs that could be utilized to supply an appropriate bias current 104. The bias current 104 is provided to the current mirror 106 to produce the write current $I_W$ through the inductive load 114 according to the current ratio of the current mirror.

In this example, the DAC 124 is a low headroom cascoded MOS current mirror. The current mirror includes main cascaded MOSFET transistors M8 and M9 connected in series between $V_{DD}$ and the current mirror 128. Output devices M10 and M11 are cascoded such that the drain of M11 provides the bias current 104. The bias current 104 is provided at a common BUS 130, which can provide bias current to other write channels in a disk drive system. The DAC 124 also includes a biasing circuit formed of transistors M12, M13, M14 and M15. A capacitor C2 operates to provide stability compensation in the DAC 124.

The current mirror 128, which provides the master current 126 to the drain of M9, for example, is a Wilson current mirror consisting of transistors Q8, Q9, Q10 and Q11 in which the emitters of Q9 and Q11 are connected to ground through degeneration resistors R3 and R4, respectively. The current mirror 128 helps isolate switching transient noise that can occur during mode transitions at bias potentials REF__A and REF__B. The switching transient, if allowed to occur, could affect the bias current during a write to read transition. This can result in a long write to read settling at the readers outputs.

To improve settling time of the write current $I_W$, a current 132 that is less than the DAC master current 126 (e.g., approximately half of the master current) can be injected and subtracted from the master DAC current 126. This current 132 is provided to the current mirror 128 by transistor M24 based on the mode signal 120. In particular, M24 provides the current to the emitter of Q9 based on the mode signal 120 indicating the read mode. This ensures that the write DAC 124 is on in read mode with less (e.g., about one-half) the biasing current of write mode. The current 132 is turned off in write mode by transistor M24. For example, the DAC master current 126 is about 200 $\mu$A in the write mode, and the injected current 132 is about 100 $\mu$A in the read mode, such that about a master current 126 of about 100 $\mu$A is provided to the DAC in the read mode. Because the DAC can turn on harder in write mode to provide the desired bias current 104, the bias current 104 and write current $I_W$ exhibit reduced decay time.

The REF__A and REF__B input signals provide a common bias of read and write. In this example, REF__A is provided to transistors M16 and M17 and the REF__B input is provided to transistors M18 and M19. Thus, the REF__A and REF__B inputs through their operation on the respective transistors M16, M17, M18, M19 provide corresponding bias currents which are in turn mirrored and provided to associated parts of the circuitry 100. In particular, a current mirror (e.g., a 1:1 current mirror) 134 includes transistors M20 and M21 and is operative to isolate noise between the respective REF__A and REF__B inputs. The current mirror 134 takes a small current from the common read-write bias REF__A and REF__B such as to substantially reduce the long settling of the write current $I_W$. The current is mirrored again by another current mirror consisting of transistors M22 and M23 and injected to the emitter of Q9 as the injected current 132.

It is to be understood and appreciated that multiple instances of mirroring current, such as utilized in the example of FIG. 4, can help ensure that the switching nodes are isolated from the common bias of REF__A and REF__B, such as to facilitate transitions between the read and write operating modes. Another transistor M25 is utilized to further mirror current to the masking system 122.

As mentioned above, the transistor M1 is controlled between ON and OFF conditions based on the mode signal 120. In particular, the mode signal 120 is provided to an inverter 140 to invert the mode signal, providing an inverted mode to the gate of M1. The inverted mode signal also is provided to a delay element, which in this example is implemented as another inverter 142. The inverter 142 operates to delay the inverted mode signal and, in turn, control operation of the masking circuit 122. In particular, the output of the inverter 142 is provided to a gate of transistor M26 which has its source coupled to receive a mirrored current from the transistor M25. M27 is cascaded with M26 to help prevent breakdown of M26 by operating in an on condition by coupling its gate to ground.

The drain of M27 is coupled to an anode of a Schottky diode which is coupled between the base and collector of transistor Q12. The collector of Q12 is coupled to the base of diode connected Q6. Thus, the Schottky clamped transistor Q12 operates to help hold down the voltage of the current mirror 106 (e.g., by keeping Q12 out of saturation) while the transistor Q12 is activated due to current flowing through M26 and M27 and through resistor R5. The duration in which the base of Q6 is held low in response to a mode transition (e.g., from the read to write mode) is determined by the delay element 142. Thus, it is to be understood and appreciated that other types of delay elements could be utilized and, that by selecting different delay elements, which can be programmable, a different delay could be set.

It is to be appreciated that the detection of a mode transition in response to switching between read and write modes is performed by PMOS M26 based on the output of the inverter 142. For example, when the mode signal goes high, the output of the inverter 142 goes high, which causes M26 to turn off. When M26 turns off, the current flowing through R5 is removed, which operates to turn off Q12. Thus, while the Q12 is on, including during an initial part of the write mode, the bias current 104 is shunted through Q12 such that Q3, Q4, Q5, Q6 and Q7 are off, although some leakage current may exist. Then, after the delay, M26 goes off which causes Q12 to turn off in a desired manner such that the bias current 104 can be provided to bias the current mirror 106 and, in turn, provide write current $I_W$ to flow through the load 114. With the bias current 104 being supplied to the current mirror 106 during the write mode, the write input signals provided at 108 and 110 control the application of write current $I_W$ through the inductive load 114. Because the masking system 124 enables the input bias 104 to settle prior to supplying the write current $I_W$, the write inputs provided at 108 and 110 also have an opportunity to settle to known states before supplying the write current. It is to be appreciated that the current mirror 106 can be configured to provide the write current $I_W$ to be proportional to the bias current 104 according to a desired current ratio. For example, the current mirror 106 can be a 10:1 current mirror, such that the current $I_W$ is ten times greater than the bias current 104. Other current ratios also could be utilized.

Figure 5:
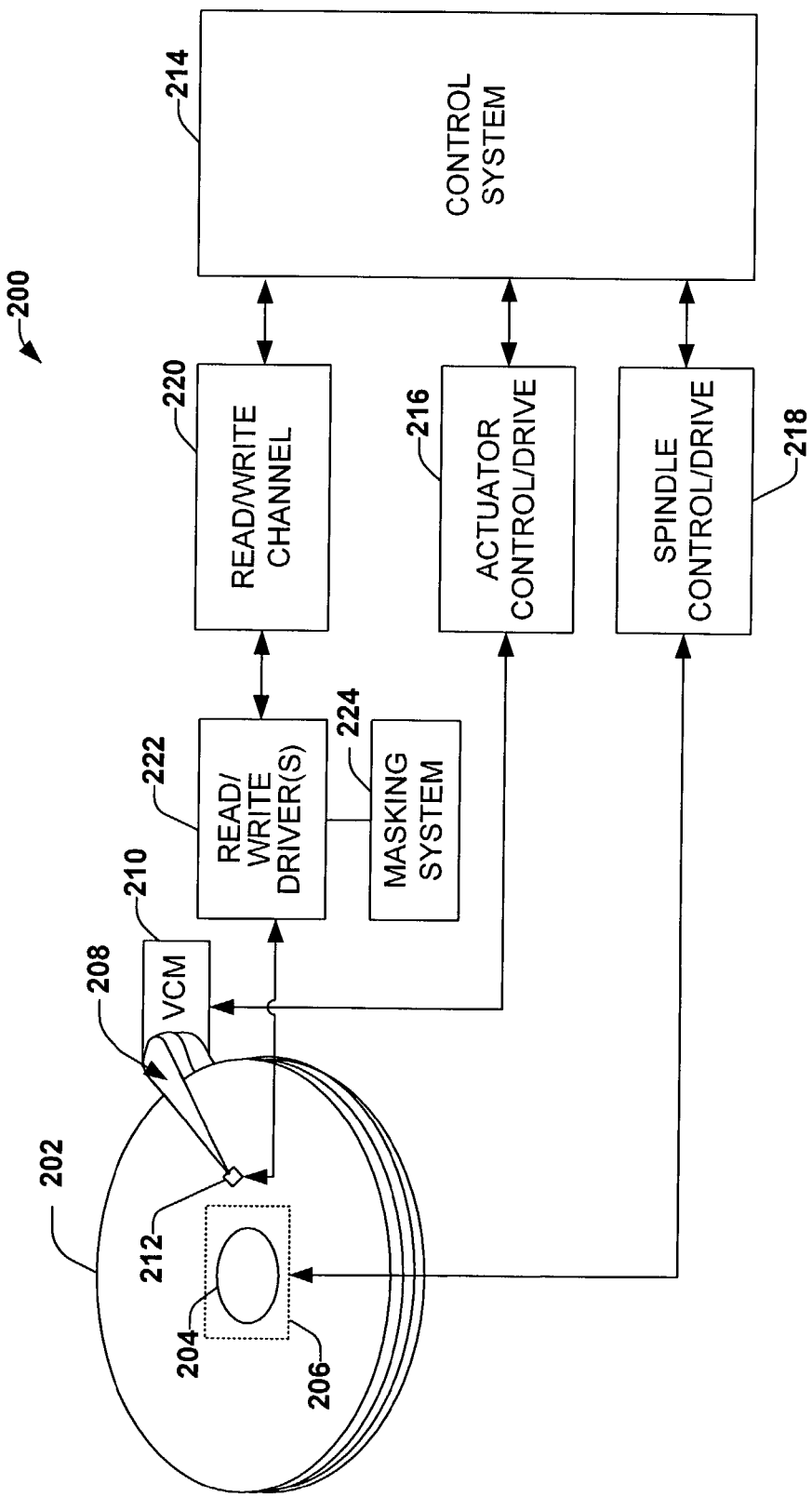
FIG. 5 is an example of a disk drive control system implemented in accordance with an aspect of the present invention.

FIG. 5 is an example of a disk drive system 200 operative to mitigate overshoot and improve settling time associated with a write signal in accordance with an aspect of the present invention. The disk drive system 200 includes a plurality of stacked magnetic recording disks 202 mounted to a spindle 204. The disks 202, for example, are conventional particulate or thin film recording disk or, alternatively, they could be liquid-bearing disks or other types of recordable (e.g., magnetic or optical) media. The spindle 204 is attached to a spindle motor, schematically indicated in phantom at 206, which rotates the spindle 204 and disks 202.

A plurality of actuator arms 208, sometimes referred to as a "comb," is arranged for movement along the surface of the respective disks 202. In order to effect movement of the arms 208, the system 200 includes a rotary voice coil motor (VCM) 210 attached to the actuator arms.

A plurality of inductive transducer heads 212 are attached to suspension assemblies of the respective actuator arms. Each head 212 includes one or more inductive write element (not shown). Each head 212 may also include an inductive read element or a MR read element. The heads 212 are positioned proximate to the disks 202 by the suspension assemblies so that, during operation, the heads are in electromagnetic communication with the disks. The VCM 210 rotates the actuator arms 208 to move the heads 212 to the desired radial position relative to the disks 202.

A control system 214 provides overall control to disk drive system 200. For example, part of the control system 214 is programmed and/or configured to control the motors 206 and 210 in the disk drive system 200, such as for controlling rotation of the disks 202 and positioning of the heads 212. The control system 214, for example, includes a central processing unit (CPU), memory and other digital circuitry (not shown). It will be understood and appreciated that the motor control functionality provided by the control system can be implemented as hardware, software or a combination of hardware and software. The control system 214 is connected to an actuator control/drive unit 216 that controls operation of the VCM 210 based on information from the control system 214. The control system 214 is also connected to a spindle control/drive unit 218 to control the spindle motor based on control information from the motor control system.

A host system (not shown), such as a computer system or personal computer (PC), can be connected to the control system 214 for implementing desired read and write operations relative to the disks 202. By way of example, the host system 180 can send digital data to the control system 214 to be stored on the disks 202, or it may request that digital data at a specified location be read from the disks and sent back to the host system.

Another part of the control system 214 thus controls reading or writing of data relative to the disks 202. For example, a read/write channel 220 is coupled to receive read and write signals generated by the control system 214. The read/write channel 220 can implement signal conditioning and communicate the read/write signals to appropriate electronics associated with the respective heads 212. In the illustrated example of FIG. 5, the electronics include one or more read/write driver(s) 222. The drivers 222 and associated circuitry can be implemented as a printed circuit board, or a flexible carrier, mounted on the actuator arms 208 or in close proximity thereto. The electronics 222 are coupled via connections in the printed circuit board to the read/write channel 220 and also to each head 212. For example, such electronics 222 can further include an integrated circuit (IC) chip including read drivers, write drivers, and associated control circuitry as well as a masking system 224 in accordance with an aspect of the present invention.

The masking system 224 is associated with the driver circuitry 222 to mitigate overshoot associated with write current, such as in response to transitioning from a read mode to a write mode, according to one or more aspects of the present invention. The masking system 224 delays biasing an output circuit for an initial part of the write mode to allow overshoot in the bias current to settle. For example, in response to the read/write channel 220 indicating a transition from a read mode to a write mode, the masking system 224 can temporarily shunt the bias current to ground or other low voltage, such that a write current mirror of the driver circuitry 222 cannot supply current to the output circuit (other than possible leakage current). After the delay has been implemented, the current shunt is removed so that the bias current can be provided to bias the current mirror and, in turn, be provided to the output circuit, such as an H-bridge circuit of the driver, for implementing a write operation. It is to be appreciated that the masking operation during such transition can be implemented with lower power consumption than most conventional approaches.

Figure 6:
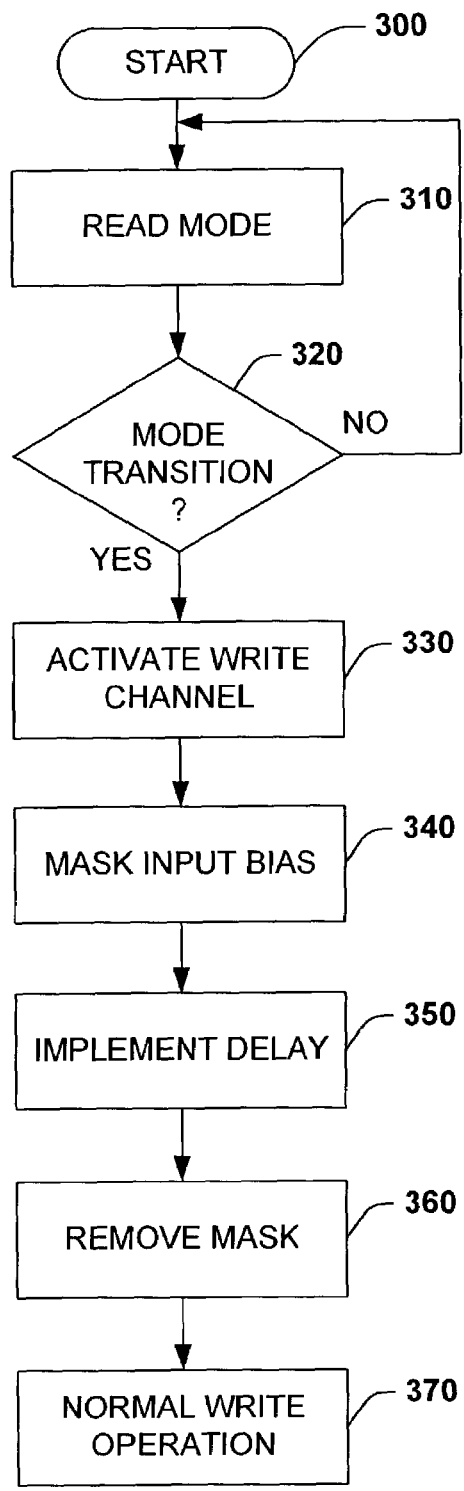
FIG. 6 is a flow diagram illustrating a methodology for mitigating overshoot in accordance with an aspect of the present invention.

In view of the foregoing structural and functional features described above, a methodology for mitigating overshoot associated with a drive current, in accordance with an aspect of the present invention, will be better appreciated with reference to FIG. 6. While, for purposes of simplicity of explanation, the methodology of FIG. 6 is shown and described as being implemented serially, it is to be understood and appreciated that the present invention is not limited to the illustrated order, as some aspects could, in accordance with the present invention, occur in different orders and/or concurrently with other aspects from that shown and described. Moreover, not all illustrated features may be required to implement a methodology in accordance with an aspect of the present invention. It is to be further understood that the following methodologies can be implemented in hardware (e.g., integrated circuits), software, or any combination thereof.

Turning to FIG. 6, the methodology begins at 300, such as in connection with supplying power to a system (e.g., a disk drive system) implemented in accordance with an aspect of the present invention. This can include initializing variables to their starting values, setting flag conditions and ramping voltage and current supplies to their appropriate levels. In this example, it is assumed that the methodology begins by entering its read mode at 310, although it will be appreciated that the methodology could initialize into any other mode.

Next, at 320 a determination is made as to whether there is a transition from the read mode to the write mode. For example, the transition can be activated based a mode control signal from an associated control system changing logic states (e.g., changing from logic low to logic high, or from high to low). If no transition occurs, the methodology can return to 310 and remain in the read mode. It is to be appreciated that alternatively, the methodology can be in an idle mode at 310. If a transition to the write mode occurs at 320, the methodology proceeds to 330.

At 330, the corresponding write channel is activated. For example, when the write channel is activated, an input bias current is provided to bias a write current mirror, which is coupled to provide a write current proportional to the input bias. The write current is used to drive an associated load, such as a write head. At 340, the input bias is steered away from the current mirror, such as by pulling an input of the current mirror to ground or another low voltage. This operates to shunt the input bias current away from the current mirror so that the current mirror remains unbiased. The shunt can be activated during the entire read mode, for example. Alternatively or additionally, the shunt could be activated in response to the read-to-write transition at 320 to be active during an initial part of the write mode.

At 350, a delay also is implemented in response to the read-to-write transition at 320. The delay thus generally occurs coextensively with 330 and 340. The delay provides a transitional time period during which the current mirror is not biased for an initial part of the write mode, such that the current mirror cannot provide the write current. After the delay has been implemented, at 360, the shunt is removed so as to allow the input bias current to bias the current mirror. At 370, normal operation of driver can be implement during the write mode, including providing write current to a write head according to write input controls (e.g., WRITE N and WRITE P). As a result of shunting the bias (or pulling the input of the current mirror low) in response to transitioning from the read mode to the write mode, overshoot in the write current can be mitigated according to an aspect of the present invention. Additionally, such an approach also can be used to improve settling time of the write current to a usable level. This further enables data to be packed more closely, which can improved the data density per track. The methodology depicted in FIG. 6 also implements such functionality in a power efficient manner.

What has been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. An overshoot protection system, comprising:
   a biasing system operative to provide an input bias to associated output circuitry based on a mode signal indicating a first of at least two operating modes;
   a masking system operative to mask the input bias from being provided to the associated output circuitry for an initial part of the first operating mode based on the mode signal indicating a transition to the first operating mode, whereby overshoot in the input bias that is received by the output circuitry is mitigated;
   the first operating mode corresponding to a write mode of a disk drive system;
   in combination with disk drive system to mitigate overshoot in write current provided to an inductive load of the disk drive system, the input bias defining an input bias current, the combination further comprising a current mirror operative to provide the write current as a function of the input bias current; and
   further comprising a digital-to-analog converter that provides the input bias current to a switch connected between the converter and an input of the current mirror according to at least one reference voltage, the switch being operative to provide the input bias current to the current mirror based on the mode signal, the masking system coupled to steer the input bias current away from the input of the current mirror for the initial part of the write mode in response to the mode signal indicating the transition to the write mode.

2. The system of claim 1, further comprising at least one switch operative to provide the input bias to the output circuitry based on the mode signal, the masking system coupled steer the input bias away from an output of the at least one switch for the initial part of the first operating mode in response to the mode signal indicating the transition to the first operating mode.

3. The system of claim 1, the output circuitry further comprising a current mirror that supplies an output bias for driving a load based on the input bias that is provided to the current mirror during the first operating mode.

4. The system of claim 1, the masking system further comprising a delay element operative to delay the mode signal and provide a delayed mode signal, such that the masking system masks the input bias for the initial part of the first operating mode based on the delayed mode signal and, after the initial part of the second operating mode, the masking system allows the input bias to be provided to the output circuitry in the first operating mode to enable the output circuitry to drive a load with an output bias proportional to the input bias.

5. The system of claim 4, the masking system further comprising a transistor coupled between an input of the output circuitry and a low potential, the transistor being operative to couple an input of the output circuitry to the low potential based on the delayed mode signal, thereby substantially preventing the input bias from biasing the output circuitry during the initial part of the first operating mode.

6. The system of claim 5, further comprising at least one switch operative having a control input that receives a signal corresponding to the mode signal, the at least one switch operative to provide the input bias to an input of the output circuitry based on the signal corresponding to the mode signal, the delay element implementing the delay based on the signal corresponding to the mode signal indicating the transition to the first operating mode.

7. The system of claim 4, the delay element comprising an inverter configured to delay the mode signal for less than about 10 nanoseconds.

* * * * *